United States Patent
Liu et al.

(10) Patent No.: US 12,414,056 B2
(45) Date of Patent: Sep. 9, 2025

(54) AUTOMATIC GAIN CONTROL SYSTEM, CONTROL METHOD, POWER DETECTOR AND RADIO FREQUENCY RECEIVER

(71) Applicants: Beijing ESWIN Computing Technology Co., Ltd., Beijing (CN); Guangzhou Transa Semi Information Technology Co., Ltd., Guangzhou (CN)

(72) Inventors: Ga Liu, Beijing (CN); Yanhui Li, Beijing (CN); Yuan Gao, Beijing (CN); Sujiang Rong, Beijing (CN)

(73) Assignees: Beijing ESWIN Computing Technology Co., Ltd., Beijing (CN); Guangzhou Transa Semi Information Technology Co., Ltd., Guangzhou (CN)

( * ) Notice: Subject to any disclaimer, the term of this patent is extended or adjusted under 35 U.S.C. 154(b) by 404 days.

(21) Appl. No.: 18/167,145

(22) Filed: Feb. 10, 2023

(65) Prior Publication Data
US 2023/0276380 A1    Aug. 31, 2023

(30) Foreign Application Priority Data
Feb. 28, 2022 (CN) .......................... 202210185341.5

(51) Int. Cl.
*H03F 3/24* (2006.01)
*G01R 21/10* (2006.01)
(Continued)

(52) U.S. Cl.
CPC .............. *H04W 52/52* (2013.01); *H03F 3/24* (2013.01); *H03G 3/3042* (2013.01)

(58) Field of Classification Search
None
See application file for complete search history.

(56) References Cited

U.S. PATENT DOCUMENTS 8,264,255 B2 *   9/2012   Sun ..................... H03G 3/3052
                                                    327/76
11,054,594 B2 *  7/2021   Zhang ................. G02B 6/4279
                                    (Continued)

FOREIGN PATENT DOCUMENTS

CN    101162912 A    4/2008
CN    101915932 A    12/2010
                      (Continued)

OTHER PUBLICATIONS

First Office Action, including Search Report, for Chinese Patent Application No. 202210185341.5, dated Oct. 14, 2022, 22 pages.
(Continued)

*Primary Examiner* — Pablo N Tran
(74) *Attorney, Agent, or Firm* — Westman, Champlin & Koehler, P.A.

(57) ABSTRACT

An automatic gain control system and a control method, a power detector and a radio frequency receiver are provided, wherein the power detector includes: a detection circuit, having a first and second input terminals connected to respective first and second differential output terminals of the trans-impedance amplifier, and configured to sample a peak of a differential output signal of the trans-impedance amplifier along with a clock cycle and provide a differential detection signal at a first output node; a filter circuit converts energy of the differential detection signal obtained at the first output node into an output voltage, so that the power detector may be used to detect an output power of the trans-impedance amplifier and adjust, by a control logic unit, a gain or an output power of a low noise amplifier connected to a radio frequency signal.

15 Claims, 4 Drawing Sheets

(51) Int. Cl.
  *H03F 1/02* (2006.01)
  *H03G 3/30* (2006.01)
  *H04W 52/52* (2009.01)

(56) References Cited

U.S. PATENT DOCUMENTS

| | | | |
|---|---|---|---|
| 2016/0284878 A1* | 9/2016 | Zarkesh-Ha | H10F 77/124 |
| 2020/0014353 A1 | 1/2020 | Kan et al. | |
| 2020/0036385 A1 | 1/2020 | Bushman | |
| 2024/0410922 A1* | 12/2024 | Abouzied | G01R 21/01 |
| 2025/0112658 A1* | 4/2025 | Coban | H04B 1/16 |

FOREIGN PATENT DOCUMENTS

| | | | | |
|---|---|---|---|---|
| CN | 102932073 A | 2/2013 | | |
| CN | 104730376 A | 6/2015 | | |
| CN | 109756240 A | 5/2019 | | |
| JP | 2006135458 A | 5/2006 | | |
| WO | WO-2022015533 A2 * | 1/2022 | | G01R 21/10 |

OTHER PUBLICATIONS

Akshatha et al., "An Efficient Cmos Mixed Signal Demodulator in 90Nm Process", 2019 4th International Conference on Recent Trends on Electronics, Information, Communication & Technology (RTEICT-2019), May 17 & 18, 2019, 5 pages.

Meijuan Zhang., "Design of Low-power SAR ADC and Fully Integrated RSSI Based on 5.8Ghz DSRC ETC Transceiver", Master's Thesis, Mar. 2018, 104 pages.

* cited by examiner

220

AUTOMATIC GAIN CONTROL SYSTEM, CONTROL METHOD, POWER DETECTOR AND RADIO FREQUENCY RECEIVER

CROSS-REFERENCE TO RELATED APPLICATION

This application claims priority to the Chinese Patent Application No. 202210185341.5, filed on Feb. 28, 2022, entitled "automatic gain control system, control method, power detector and radio frequency receiver", and published as CN114567278A on May 31, 2022, which is incorporated herein by reference in its entirety in this disclosure.

BACKGROUND OF THE DISCLOSURE

Field of Technology

The present disclosure relates to a field of integrated circuit technology, and in particular, to an automatic gain control system, a control method, a power detector, and a radio frequency receiver.

Description of the Related Art

An existing radio frequency transmission standard requires that a radio frequency receiver needs to normally work in a large dynamic range of input signals, and in order to ensure normally working of an analog circuit, prevent situations of output saturation and the like, and ensure a signal-to-noise ratio required by digital demodulation, a detection feedback loop of automatic gain control (AGC) usually used in a link of whole receiver. The detection feedback loop generally includes a detection module, a quantization module and a digital processing module. In recent years, various detection circuits and algorithms of whole AGC loop are proposed, but designs of most of the detection circuits are complex, and an amplification circuit and a detector are usually included, so that a design of the whole AGC loop cannot be simplified, and the design of the AGC loop occupies a large area in whole receiver link. In recent years, much effort is not made in this direction, most of the effort is made in a direction of refinement for higher detection accuracy, but the detection accuracy is not required to be too high and there will be requirements for area and circuit consumption for some applications, so that a design of the detector needs to be simplified to optimize the whole AGC loop for some application occasions.

A conventional AGC control process may include following processes: amplifying a radio frequency (RF) signal received through an antenna by a low noise amplifier (LNA), and frequency-converting which by a mixer, power-amplifying which by a trans impedance amplifier (TIA), filtering which by a low pass filter (LPF), and outputting which to a programmable gain amplifier (PGA). Wherein, a power detector (PWD) in a feedback regulation loop is used to detect the output power of the TIA, and convert a detected power value into a voltage signal to be transmitted to an analog-to-digital converter (ADC). The ADC is used to receive the voltage signal from the PWD, quantize the voltage signal into a digital signal and outputting a quantized digital signal to a control logic unit. The control logic unit is used to perform digital logic control on an input digital signal so as to realize gain adjustment on the LNA.

However, in an existing research, the power detector with a high dynamic range includes more circuit modules, a structure is complex, and when an input power is larger, a power consumption of the power detector is also higher; thus, although the power detector has a high dynamic range, its application is limited due to high power consumption and high cost.

SUMMARY

The present disclosure provides an automatic gain control system, a control method, a power detector and a radio frequency receiver, a function of the power detector may be realized through a simple circuit design, which has a simple principle, and is convenient to realize.

In one aspect, the present disclosure provides a power detector for an automatic gain control system, the power detector is configured to detect an output power of a trans-impedance amplifier and adjust, by a control logic unit, a gain or an output power of a low noise amplifier connected to a radio frequency signal, the power detector comprises:
 a detection circuit, which has a first input terminal connected to a first differential output terminal of the trans-impedance amplifier and a second input terminal connected to a second differential output terminal of the trans-impedance amplifier, and is configured to sample a peak of a differential output signal of the trans-impedance amplifier along with a clock cycle and provide a differential detection signal at a first output node;
 a filter circuit, which is connected to the detector circuit, and is configured to convert energy of the differential detection signal obtained at the first output node into an output voltage.

In some embodiments, the detection circuit comprises:
 a first transistor, a second transistor and a third transistor, wherein a first terminal of the first transistor and a first terminal of the second transistor are connected to a power supply terminal, a second terminal of the first transistor and a second terminal of the second transistor are connected to a first terminal of the third transistor, and a second terminal of the third transistor is connected to ground,
 a control terminal of the first transistor is connected to the first differential output terminal of the trans-impedance amplifier through a first filter network to receive a first differential signal, a control terminal of the second transistor is connected to the second differential output terminal of the trans-impedance amplifier through a second filter network to receive a second differential signal, and a control terminal of the third transistor is connected to a bias voltage,
 the first terminal of the third transistor serves as the first output node for providing the differential detection signal.

In some embodiments, the first filter network comprises:
 a first resistor and a first capacitor, connected in series between a common-mode input terminal and the first differential output terminal, and a connection node between the first resistor and the first capacitor is connected to the control terminal of the first transistor.

In some embodiments, the second filter network comprises:
 a second resistor and a second capacitor, connected in series between the common-mode input terminal and the second differential output end, and a connection node between the second resistor and the second capacitor is connected to the control terminal of the second transistor.

In some embodiments, wherein the first resistor has a same specification as the second resistor, and the first capacitor has a same specification as the second capacitor.

In some embodiments, the filter circuit comprises:
a third resistor and a third capacitor, connected in series between the first output node and ground, and a connection node between the third resistor and the third capacitor serves as an output terminal of the power detector for providing the output voltage.

In some embodiments, any one of the first transistor, the second transistor, and the third transistor is an N-channel type metal oxide semiconductor field effect transistor device.

In another aspect, the present disclosure further provides an automatic gain control system, comprising:
a main circuit, which comprises a low noise amplifier, a mixer, a trans-impedance amplifier, a low-pass filter and a programmable gain amplifier connected in sequence, and the trans-impedance amplifier having a first differential output terminal for providing a first differential signal and a second differential output terminal for providing a second differential signal; and
a power detector, an analog-to-digital converter and a control logic unit in a feedback loop, wherein the power detector is the power detector according to any power detector according to the present disclosure, and is configured to detect an output power of a trans-impedance amplifier and adjust, by the control logic unit, a gain or an output power of a low noise amplifier connected to a radio frequency signal.

In some embodiments, the analog-to-digital converter is configured to quantize an output voltage generated by the power detector to generate a voltage code with a constant parameter.

In some embodiments, the analog-to-digital converter comprises:
a reference voltage generating circuit, which comprises a resistor string sequentially connected between a power supply terminal and ground in series, and provides at least one reference voltage and a common-mode voltage required by a post-circuit by conducting a connecting node between at least two adjacent resistors;
a level shift circuit, configured to generate a base voltage that varies with a process angle of the power detector and a temperature in a same proportion according to a power supply voltage, the at least one reference voltage and the common-mode voltage;
a comparator array, configured to sequentially compare the output voltage with the base voltage according to a time sequence of a clock cycle to generate a thermometer code;
an encoding circuit, connected to the comparator array for converting the thermometer code to a binary code;
an output register circuit, configured to receive the binary code and output the binary code to the low noise amplifier along with a clock cycle.

In some embodiments, the level shift circuit comprises:
a fourth transistor, a fifth transistor and a sixth transistor, wherein a first terminal of the fourth transistor and a first terminal of the fifth transistor are connected to the power supply terminal, a second terminal of the fourth transistor and a second terminal of the fifth transistor are connected to a first terminal of the sixth transistor, and a second terminal of the sixth transistor is connected to ground,
a control terminal of the fourth transistor and a control terminal of the fifth transistor are respectively connected to the reference voltage, a control terminal of the sixth transistor is connected to the bias voltage,
a first terminal of the sixth transistor serves as the second output node for providing the base voltage.

In some embodiments, the fourth transistor has the same temperature coefficient as the first transistor, the fifth transistor has the same temperature coefficient as the second transistor, and the sixth transistor has the same temperature coefficient as the third transistor.

In another aspect, the present disclosure further provides a control method for above automatic gain control system, comprising:
detecting the output power of the trans-impedance amplifier in the main circuit of the automatic gain control system by using the power detector in the feedback loop of the automatic gain control system; and
acquiring a detection result, converting the detection result into a generated signal through the control logic unit, and adjusting the gain or the output power of the low noise amplifier connected to the radio frequency signal.

In some embodiments, the step of acquiring a detection result, converting the detection result into a generated signal through the control logic unit, and adjusting the gain or the output power of the low noise amplifier connected to the radio frequency signal comprises:
providing at least one reference voltage and a common-mode voltage required by a post-circuit by using a reference voltage generating circuit;
generating a base voltage that varies with a process angle of the power detector and a temperature in a same proportion according to a power supply voltage, the at least one reference voltage and the common-mode voltage;
comparing the output voltage with the base voltage according to a time sequence of a clock cycle to generate a thermometer code;
converting the thermometer code to a binary code;
receiving the binary code and outputting the binary code to the low noise amplifier along with a clock cycle.

In another aspect, the present disclosure further provides a radio frequency receiver, comprising the above power detector.

A beneficial effect of the present disclosure is: the present disclosure provides the automatic gain control system, the control method, the power detector and the radio frequency receiver, wherein the power detector includes: the detection circuit, having the first input terminal connected to the first differential output terminal of the trans-impedance amplifier and the second input terminal connected to the second differential output terminal of the trans-impedance amplifier, and is configured to sample the peak of the differential output signal of the trans-impedance amplifier along with the clock cycle and provide the differential detection signal at the first output node; the filter circuit, connected to the detector circuit, and is configured to convert energy of the differential detection signal obtained at the first output node into the output voltage, so that the power detector may be used to detect the output power of the trans-impedance amplifier and adjust, by the control logic unit, the gain or the output power of the low noise amplifier connected to the radio frequency signal, and compared with other structures in prior art, it has simple structure and operation principle, good reliability and reusability, low cost, and is convenient to realize.

Secondly, the automatic gain control system provided by the present disclosure is added with a level shift circuit which is matched with the power detector, and configured to convert a constant reference voltage of the analog-to-digital converter into the base voltage changing proportionally with a voltage signal output by the power detector along with changes of Process Voltage Temperature (PVT), so that a PVT error output by the power detector is well counteracted at a side of the analog-to-digital converter, and an accuracy of the system under the PVT is well realized.

BRIEF DESCRIPTION OF THE DRAWINGS

The above and other objects, features and advantages of the present disclosure will become more apparent from following description of the embodiments of the present disclosure with reference to accompanying drawings.

DETAILED DESCRIPTION OF THE DISCLOSURE

Figure 1:
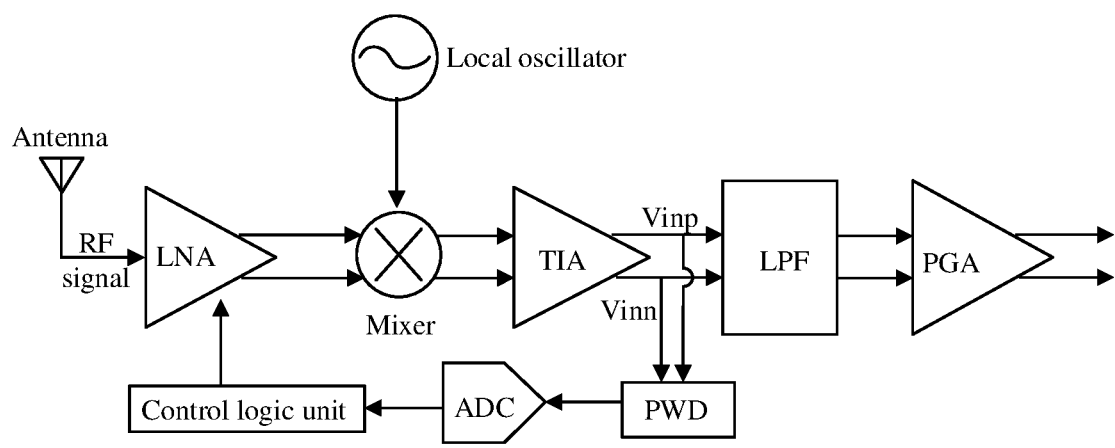
FIG. 1 is a schematic block diagram of a structure of an automatic gain control system according to an embodiment of the present disclosure.

To facilitate an understanding of the present disclosure, the present disclosure will now be described more fully with reference to the accompanying drawings. Preferred embodiments of the present disclosure are shown in the drawings. However, the present disclosure may be embodied in different forms and should not be construed as limited to the embodiments set forth herein. Rather, these embodiments are provided so that this disclosure will be thorough and complete.

Unless defined otherwise, all technical and scientific terms used herein have a same meaning as commonly understood by one of ordinary skill in the art to which this application belongs. The terms used in the description of the present disclosure are for a purpose of describing particular embodiments only and is not intended to be limiting of the present disclosure.

A wireless device (e.g., a cellular telephone or smartphone) may transmit and receive data to communicate bi-directionally with a wireless communication system. The wireless device may include a transmitter for data transmission and a receiver for data reception. For data transmission, in the transmitter, an analog output baseband signal may be amplified by an amplifier, filtered by a low pass filter to suppress image frequency resulting from digital to analog conversion, amplified by a variable gain amplifier (VGA), and converted from baseband to an RF signal by a frequency transformer, a modulated RF signal is amplified to obtain an output RF signal having a proper output power level, and the output RF signal is transmitted via an antenna to a base station. For data reception, the receiver may obtain a received RF signal via the antenna, amplify and convert the received RF signal with a receive LO signal, and process a converted signal to recover data transmitted by the base station.

The wireless device may include a power detector for measuring power of the RF signal. The power detector may provide an output signal that may be a square function of an input signal and may be referred to as a square law detector. The power detector may be implemented with complementary metal oxide semiconductor (CMOS) transistors, and may convert the input signal power into an output current by using a square-law relationship between drain current and gate voltage of the CMOS transistors. The power detector is associated with a power detector gain, which is a conversion gain between the output current and the power of the input signal. The gain of the power detector may be proportional to the electron mobility, which may be a function of temperature. Therefore, the gain of the power detector will vary with temperature, for example, variation by up to 7 decibels (dB) for some integrated circuit (IC) processes. Variations in the gain of the power detector with temperature may affect an accuracy of detection of the power detector.

In a wireless communication system, an RF power detector is applied to an RF front-end circuit to optimize signal power consumption, improve efficiency, gain, and power linearity of a circuit unit, and automatically control output power or gain of the circuit. This power measurement has a variety of uses, including controlling the output of RF amplifiers in order to increase their efficiency and ensure that they transmit RF signals at a proper amplitude.

Since the RF power detector is used to measure power, many characteristics are desirable. For example, one desirable attribute of the RF power detector is linear response in normal dynamic range in order to ensure predictability and accuracy of measurements. Another desirable attribute is temperature compensation, since the power detector outputting varies with operating temperature are generally less predictable. Another desirable attribute is directional coupling. More specifically, it is generally desirable that the RF power detector be sensitive only to the power delivered by a monitored RF signal source and insensitive to other RF signal sources, such as reflected signals and ambient noise.

In these attributes, there is a continuing effort to improve various characteristics of circuits of the RF power detector.

In current circuit design for signal power detection, adopted design technologies mainly comprises two schemes, one scheme is peak power detection, and the other scheme is root mean square (RMS) power detection; a mode of the peak power detection is mainly suitable for conditions that an envelope of an output signal is constant and a peak-to-average ratio of the output signal is low; a mode of the RMS power detection is suitable for output modulation signal with high peak-to-average ratio and good precision, and is capable of realizing a linear conversion of the power of an output direct-current voltage signal of the power detector and the power of the input modulation signal, that is, linear in dB. Ways of realizing the power detector by using method of the RMS power detection may be realized based on the following methods: (1) a thermoelectric device mode; (2) a diode mode; (3) a bipolar transistor implementation mode; (4) a metal oxide semiconductor field effect transistor (MOSFET, hereinafter referred to as MOS transistor) mode; in current design trend, the integrated circuit application integration level is higher and higher, and for a purpose of low cost, a standard CMOS process becomes a mainstream application, so that the mode (4) becomes a most current and most extensive application mode; in the mode of realizing the power detection by adopting the MOS transistor, some designs realize the power detection based on a current square law electrical characteristic of the MOS transistor, but have a narrower input power detection range; others designs adopt a plurality of basic units in order to realize wide dynamic range, but have difficulty in realizing good linearity; some designs adopt a mode of combining a logarithmic amplifier and a rectifier in order to realize good linearity, but in an application of a microwave millimeter wave system, in which a frequency reaches dozens of GHz, the gain of the logarithmic amplifier cannot be ensured, and the application under high frequency is difficult to realize.

The present disclosure will be described in detail below with reference to the accompanying drawings.

Figure 2:
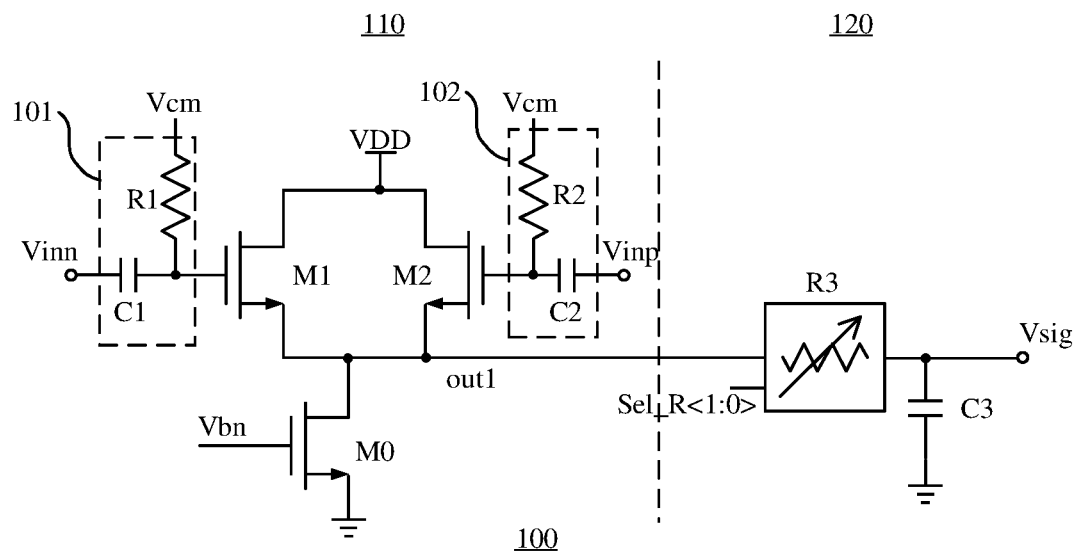
FIG. 2 is a schematic circuit diagram of a power detector for an automatic gain control system according to an embodiment of the present disclosure.
Figure 3:
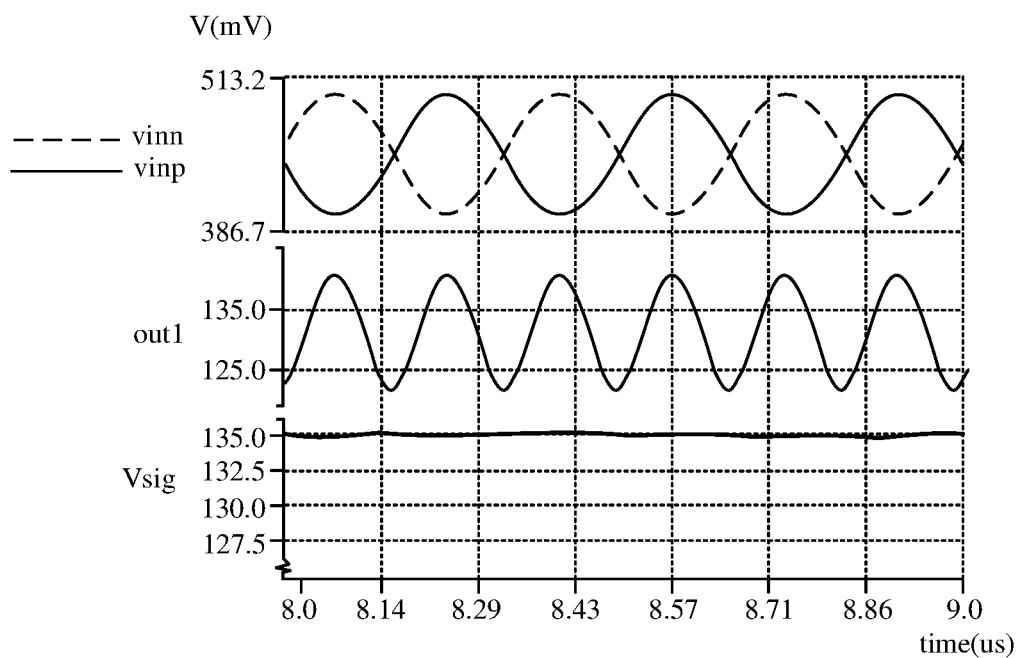
FIG. 3 is a timing waveform diagram of various signals in the power detector shown in FIG. 2.

FIG. 1 is a schematic block diagram of a structure of an automatic gain control system according to an embodiment of the present disclosure, FIG. 2 is a schematic circuit diagram of a power detector for an automatic gain control system according to an embodiment of the present disclosure, FIG. 3 is a timing waveform diagram of various signals in the power detector shown in FIG. 2.

Embodiments of the present disclosure provide an automatic gain control (AGC) system, which also serves as a transmitter system for a power detector (PWD), as shown in FIG. 1. With reference to FIG. 1 to FIG. 3, an AGC system provided in the embodiment of the present disclosure is understood, wherein the AGC system includes:

a main circuit, including an antenna, a low noise amplifier (LNA), a mixer connected to a local oscillator signal, a trans-impedance amplifier (TIA), a low pass filter (LPF) and a programmable gain amplifier (PGA) which are connected in sequence, wherein the TIA having a first differential output terminal for providing a first differential signal Vinn and a second differential output terminal for providing a second differential signal Vinp; and a power detector (PWD), an analog-to-digital converter (ADC) and a control logic unit located in a feedback regulation loop. The TIA may also be referred to as a power amplifier or may be replaced with a power amplifier, and has a function of amplifying power.

Referring to FIG. 2, in the present embodiment, the power detector (PWD)100 includes: a detection circuit 110 and a filter circuit 120, a first input terminal and a second input terminal of the detector circuit 110 are sequentially connected to the first differential output terminal and the second differential output terminal of the trans-impedance amplifier (TIA), and are configured to sample peaks of differential output signals (Vinn and Vinp) of the trans-impedance amplifier (TIA) following a clock cycle and provide a differential detection signal out1 through a first output node; the filter circuit 120 is connected to the detector circuit 110 for converting an energy of obtained differential detection signal out1 into an output voltage Vsig, which is used to characterize a output power of the trans-impedance amplifier (TIA).

Further, in the present embodiment, the detector circuit 110 includes:

a first transistor M1, a second transistor M2, and a third transistor M0, wherein a first terminal of the first transistor M1 and a first terminal of the second transistor M2 are commonly connected to a power supply terminal, a second terminal of the first transistor M1 and a second terminal of the second transistor M2 are commonly connected to a first terminal of the third transistor M0, a second terminal of the third transistor M0 is connected to ground, a control terminal of the first transistor M1 is connected to the first differential output terminal of the trans-impedance amplifier through a first filter network 101 to receive a first differential signal Vinn, a control terminal of the second transistor M2 is connected to the second differential output terminal of the trans-impedance amplifier through a second filter network 102 to receive a second differential signal Vinp, and a control terminal of the third transistor M0 is connected to a bias voltage Vbn, the first terminal of the third transistor M0 serves as the first output node for providing the differential detection signal out1. Specifically, in the present embodiment, the first transistor M1 and the second transistor M2 have quasi-static gate structures, peaks of the first differential signal Vinn and the second differential signal Vinp are respectively sampled by the first transistor M1 and the second transistor M2, and the differential detection signal out1 output by the first output node is a total signal of the differential signals (Vinp and Vinn).

Further, in the present embodiment, the first filter network 101 includes:

a first resistor R1 and a first capacitor C1, wherein the first resistor R1 and the first capacitor C1 are connected in series between a common-mode input terminal and the first differential output terminal, and a connection node between the first resistor R1 and the first capacitor C1 is connected to the control terminal of the first transistor M1.

Further, in the present embodiment, the second filter network 102 includes:

a second resistor R2 and a second capacitor C2, wherein the second resistor R2 and the second capacitor C2 are connected in series between the common-mode input terminal and the second differential output terminal, and a connection node between the second resistor R2 and the second capacitor C2 is connected to the control terminal of the second transistor M2.

Further, in the present embodiment, the first resistor has a same specification (i.e., resistance value) as the second resistor, and the first capacitor has a same specification (i.e., capacitance value) as the second capacitor.

Further, in the present embodiment, the filter circuit 120 includes:

a third resistor R3 and a third capacitor C3, the third resistor R3 and the third capacitor C3 are connected in series between the first output node and ground, and a connection node between the third resistor R3 and the third capacitor C3 serves as an output terminal of the power detector (PWD)100 for providing the output voltage Vsig.

Further, in the present embodiment, the third resistor R3 includes a sliding variable resistance device, and a resistance value participating in operation may be selected according to a filtering requirement of the system.

In alternative embodiments, the filter circuit 120 may be implemented by many kinds of manners, and regarding an implementation manner of a low-pass filter circuit, reference may be made to conventional art, and details of the embodiment of the present disclosure are not repeated.

Further, in the present embodiment, any one of the first Transistor M1, the second Transistor M2, and the third Transistor M0 is an N-channel metal oxide semiconductor field effect transistor (MOSFET, hereinafter referred to as MOS transistor). It is known that a transistor having a metal-oxide-semiconductor is referred to the MOS transistor, and is divided into P-type MOS transistor and N-type MOS transistor. An integrated circuit formed by the MOS transistors is called an MOS integrated circuit, and a complementary MOS integrated circuit includes the PMOS transistors and the NMOS transistors is a CMOS integrated circuit. An MOS transistor formed by a P-type substrate and two high-concentration N diffusion regions is called an N-channel MOS transistor, and when the N-channel MOS transistor is conducted, an N-type conduction channel is formed between the two high-concentration N diffusion regions. An N-channel enhancement type MOS transistor has to apply forward bias on a gate electrode, and only when a gate-source voltage is larger than a threshold voltage, the conductive channel is generated in the N-channel MOS transistor. An N-channel depletion type MOS transistor is the N-channel MOS transistor with the conductive channel generated when no gate voltage is applied (the gate-source voltage is zero).

In the present embodiment, the power detector (PWD) 100 is configured to detect an output power of the trans-impedance amplifier (TIA), and adjust a gain or an output power of the low noise amplifier (LNA) connected to the radio frequency (RF) signal through a control logic unit, compared with other power detection structures in prior art, it has simple operation principle, good reliability and reusability, and is convenient to realize.

Figure 4:
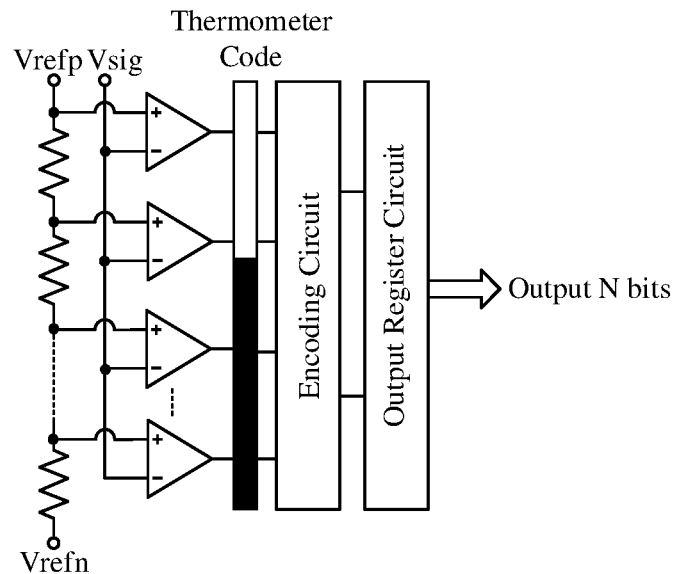
FIG. 4 is a schematic diagram of an analog-to-digital converter in the automatic gain control system shown in FIG. 1.
Figure 5:
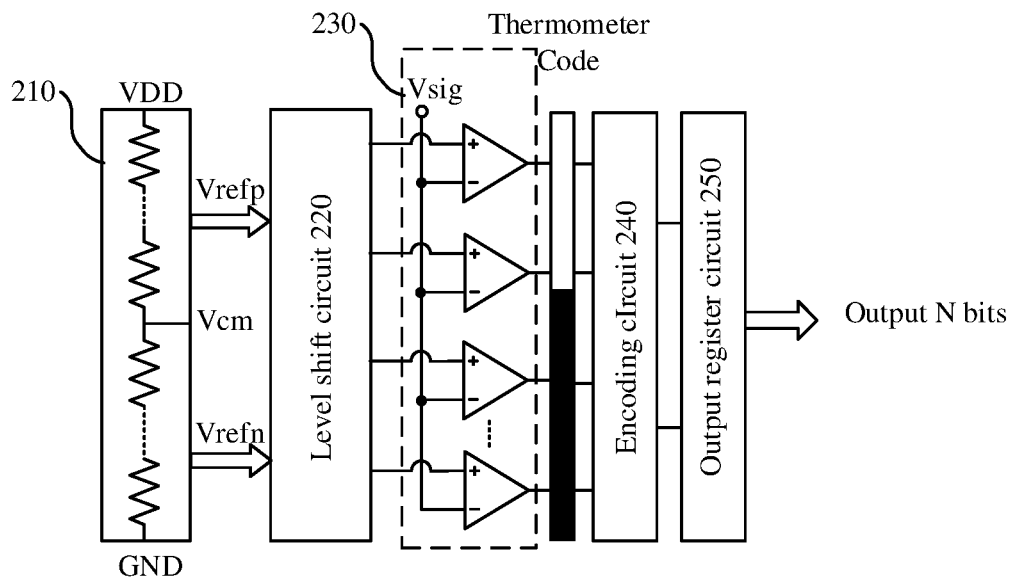
FIG. 5 is a schematic diagram of an architecture of an analog-to-digital converter in an automatic gain control system according to an embodiment of the present disclosure.
Figure 6:
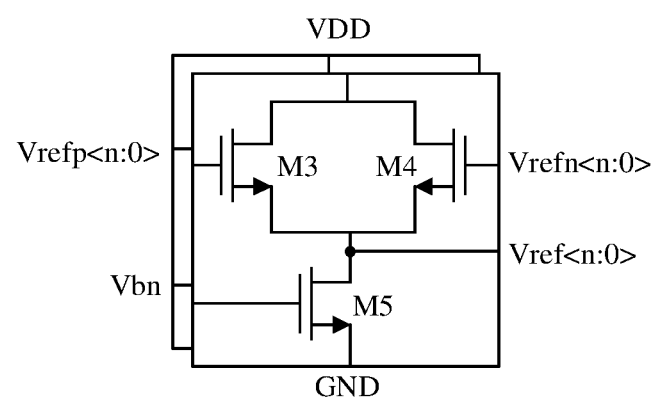
FIG. 6 is a schematic diagram of a structure of a level shift circuit in the analog-to-digital converter shown in FIG. 5.

FIG. 4 is a schematic diagram of an analog-to-digital converter in the automatic gain control system shown in FIG. 1, FIG. 5 is a schematic diagram of an architecture of an analog-to-digital converter in an automatic gain control system according to an embodiment of the present disclosure, FIG. 6 is a schematic diagram of a structure of a level shift circuit in the analog-to-digital converter shown in FIG. 5.

In an existing AGC control system, the output power of the power amplifier (TIA), that is, a voltage signal output by the PWD, varies with the Process Voltage Temperature (PVT), and a digital signal obtained by a conventional ADC processing the varying voltage signal also varies, which may result in different results being quantized after the AGC control system, which may result in a narrow detection range and low linearity of the PWD, and affect an accuracy of the AGC control system under the PVT.

As shown in FIG. 4, in a conventional flash ADC circuit structure, a signal to be measured (the output voltage Vsig) is uniformly connected to negative input terminals of comparators, positive input terminals of the comparators are respectively connected to corresponding reference voltage values (Vrefn and Vrefp), an output of the comparator is in a thermometer code form, and an encoding circuit is required to convert the thermometer code into a binary code, and then an output register uniformly outputs a conversion result. The ADC with the structure has advantages that a conversion time of the whole ADC is almost the time of one comparator, so speed is extremely high, but $2^N$ comparators are needed for data transmission of N bits, and the comparators consume too large area, so that precision is not high generally, and the comparators are only suitable for an application of an AGC detection loop. However, the flash ADC with the structure adopts a constant reference voltage, and according to the power detector (PWD) 100 shown in FIG. 2, the differential output signal of the trans-impedance amplifier (TIA) is sampled by the capacitor C1 (or C2), rectified by the NMOS transistor M1 (or M2), and then passes through the filter circuit 120, whole processes are varied with change of a process angle and a temperature, and mainly affects the capacitance value of the capacitor and characteristics of the NMOS transistor, so that the output voltage Vsig of the capacitor is different in performance under different process angles and temperatures, and therefore, the bias voltage Vsig appears error in a detection result, resulting in poor accuracy of the system under PVT.

Referring to FIG. 5 and FIG. 6, in the AGC system provided in the present embodiment, an analog-to-digital converter (ADC) 200 may be used to perform quantization processing on the output voltage Vsig generated by the power detector (PWD) 100, generating a constant voltage code that does not vary with process corner and temperature.

Further, in the present embodiment, the analog-to-digital converter (ADC) 200 is similar to the flash ADC shown in FIG. 4, except that: the AGC system provided by the embodiment of the present application directly inserts a level shift circuit 220 between the constant reference voltage and the comparators on a basis of the conventional flash ADC.

As shown in FIG. 5, in the present embodiment, the analog-to-digital converter (ADC) 200 includes: a reference voltage generating circuit 210, a level shift circuit 220, a comparator array 230, an encoding circuit 240 and an output register circuit 250, the reference voltage generating circuit 210 includes a resistor string sequentially connected between a power supply terminal and ground in series, and provides at least one reference voltage (Vrefn and Vrefp) and a common-mode voltage Vcm required by a post-circuit by conducting a connecting node between at least two adjacent resistors;

the level shift circuit 220 is configured to generate a base voltage Vref that varies with a process corner of the power detector (PWD) 100 and temperature in a same proportion according to a power supply voltage VDD, the at least one reference voltage (Vrefn and Vrefp) and the common-mode voltage Vcm, which are connected to the power supply terminal, as shown in FIG. 6;

the comparator array 230 includes a plurality of comparators for sequentially comparing the output voltage Vsig with the base voltage Vref <n:0> according to a time sequence of a clock cycle to generate a thermometer code;

the encoding circuit 240 is connected to the comparator array 230 for converting the thermometer code to a binary code;

the output register circuit 250 is used to receive the binary code and output the binary code to the low noise amplifier (LNA) following a clock cycle.

Further, referring to FIG. 6, in the present embodiment, the level shift circuit 220 includes:

a fourth transistor M3, a fifth transistor M4, and a sixth transistor M5, wherein a first terminal of the fourth transistor M3 and a first terminal of the fifth transistor M4 are commonly connected to the power supply terminal, a second terminal of the fourth transistor M3 and a second terminal of the fifth transistor M4 are commonly connected to a first terminal of the sixth transistor M5, a second terminal of the sixth transistor M5 is connected to ground, a control terminal of the fourth transistor M3 and a control terminal of the fifth transistor M4 are respectively connected to the at least one reference voltage (Vrefp <n:0> and Vrefn <n:0>), the control terminal of the sixth transistor M5 is connected to the bias voltage Vbn, a first terminal of the sixth transistor M5 serves as the second output node for providing the base voltage Vref <n:0>.

Further, in the present embodiment, the fourth transistor M3 has the same temperature coefficient as the first transistor M1, the fifth transistor M4 has the same temperature coefficient as the second transistor M2, and the sixth transistor M5 has the same temperature coefficient as the third transistor M0.

In the present embodiment, the level shift circuit 220 may be regarded as a mirror circuit of the power detector (PWD) 100, which successfully replicates characteristics of each NMOS transistor in the power detector (PWD) 100, as shown in FIG. 2 and FIG. 6, the level shift circuit 220 inputs a fixed voltage and outputs a base voltage varying with the process corner and the temperature. Although a measured signal (i.e., the output voltage Vsig) inputted by the analog-to-digital converter (ADC) 200 will vary with the process temperature and the process angle, the base voltage Vref will also vary proportionally with the process temperature and the process angle, so that an output of the ADC 200 will not vary with the process temperature and the process angle, and is always a constant value.

Therefore, in the AGC system provided by the embodiment of the present disclosure, the analog-to-digital converter (ADC) 200 and the power detector (PWD) 100 may implement characteristic matching, so that the analog-to-digital converter (ADC) 200 may convert a fixed reference voltage into the base voltage Vref that varies in proportion to the output voltage Vsig of the power detector (PWD) 100 with PVT variation, so that PVT error output by the power detector (PWD)100 is well cancelled at the side of the analog-to-digital converter (ADC)200, thereby well implementing accuracy of system under the PVT, and effectively avoiding the problems in the prior art that the detection range of the power detector (PWD) is narrow, the linearity is low, and the application at high frequency is difficult, etc.

In another aspect, the present disclosure further provides a control method for the AGC system according to the above embodiments, which includes:
  detecting the output power of the trans-impedance amplifier in the main circuit of the automatic gain control system by using the power detector in the feedback loop of the automatic gain control system; and
  acquiring a detection result, converting the detection result into a generated signal through the control logic unit, and adjusting the gain or the output power of the low noise amplifier connected to the radio frequency signal.

Preferably, the step of acquiring a detection result, converting the detection result into a generated signal through the control logic unit, and adjusting the gain or the output power of the low noise amplifier connected to the radio frequency signal comprises:
  provides at least one reference voltage and a common-mode voltage required by a post-circuit by using a reference voltage generating circuit;
  generating a base voltage that varies with a process angle of the power detector and a temperature in a same proportion according to a power supply voltage, the at least one reference voltage and the common-mode voltage;
  comparing the output voltage with the base voltage according to a time sequence of a clock cycle to generate a thermometer code;
  converting the thermometer code to a binary code;
  receiving the binary code and outputting the binary code to the low noise amplifier along with a clock cycle.

It is further noted that the power detector (PWD) 100 provided by embodiments of the present disclosure may be used in a variety of electronic devices, such as wireless communication devices, smart phones, tablet computers, personal digital assistants (PDAs), handheld devices, wireless modems, laptop computers, smart books, netbooks, cordless phones, Wireless Local Loop (WLL) stations, Bluetooth devices, consumer electronics devices, and the like. For clarity, an application of the power detector in a wireless communication device is described below.

In addition, the power detector (PWD) 100 provided in the embodiments of the present disclosure may also be used in various components or devices such as a power amplifier, a receiver, a transmitter, and the like.

It should be noted that in the description of the present disclosure, it is to be understood that the terms "upper", "lower", "inner", and the like, indicate orientation or positional relationship, are only for convenience of describing the present disclosure and simplifying the description, but do not indicate or imply that the referenced components or elements must have a particular orientation, be constructed and operated in a particular orientation, and therefore should not be construed as limiting the present disclosure.

Further, in this document, the contained terms "include", "contain" or any other variation thereof are intended to cover a non-exclusive inclusion, so that a process, a method, an article or an apparatus including a series of elements includes not only those elements but also other elements not explicitly listed or inherent to such process, method, article or apparatus. Without further limitation, an element defined by the phrase "comprising an . . . " does not exclude the presence of other identical elements in a process, method, article, or apparatus that comprises the element.

Finally, it should be noted that: it should be understood that the above examples are only for clearly illustrating the present disclosure and are not intended to limit the embodiments. Other variations and modifications will be apparent to persons skilled in the art in light of the above description. And are neither required nor exhaustive of all embodiments. And obvious variations or modifications of this disclosure may be made without departing from the spirit or scope of the disclosure.

What is claimed is:

1. A power detector for an automatic gain control system, wherein the power detector is configured to detect an output power of a trans-impedance amplifier and adjust, by a control logic unit, a gain or an output power of a low noise amplifier connected to a radio frequency signal, the power detector comprises:
  a detection circuit, which has a first input terminal connected to a first differential output terminal of the trans-impedance amplifier and a second input terminal connected to a second differential output terminal of the trans-impedance amplifier, and is configured to sample a peak of a differential output signal of the trans-impedance amplifier along with a clock cycle and provide a differential detection signal at a first output node; and
  a filter circuit, which is connected to the detector circuit, and is configured to convert energy of the differential detection signal obtained at the first output node into an output voltage.

2. The power detector according to claim 1, wherein the detection circuit comprises:

a first transistor, a second transistor and a third transistor, wherein a first terminal of the first transistor and a first terminal of the second transistor are connected to a power supply terminal, a second terminal of the first transistor and a second terminal of the second transistor are connected to a first terminal of the third transistor, and a second terminal of the third transistor is connected to ground, a control terminal of the first transistor is connected to the first differential output terminal of the trans-impedance amplifier through a first filter network to receive a first differential signal, a control terminal of the second transistor is connected to the second differential output terminal of the trans-impedance amplifier through a second filter network to receive a second differential signal, and a control terminal of the third transistor is connected to a bias voltage, the first terminal of the third transistor serves as the first output node for providing the differential detection signal.

3. The power detector according to claim 2, wherein the first filter network comprises:
a first resistor and a first capacitor, connected in series between a common-mode input terminal and the first differential output terminal, and a connection node between the first resistor and the first capacitor is connected to the control terminal of the first transistor.

4. The power detector according to claim 3, wherein the second filter network comprises:
a second resistor and a second capacitor, connected in series between the common-mode input terminal and the second differential output end, and a connection node between the second resistor and the second capacitor is connected to the control terminal of the second transistor.

5. The power detector according to claim 4, wherein the first resistor has a same specification as the second resistor, and the first capacitor has a same specification as the second capacitor.

6. The power detector according to claim 5, wherein the filter circuit comprises:
a third resistor and a third capacitor, connected in series between the first output node and ground, and a connection node between the third resistor and the third capacitor serves as an output terminal of the power detector for providing the output voltage.

7. The power detector according to claim 2, wherein any one of the first transistor, the second transistor, and the third transistor is an N-channel type metal oxide semiconductor field effect transistor device.

8. A radio frequency receiver, comprising a power detector according to claim 1.

9. An automatic gain control system, comprising:
a main circuit, which comprises a low noise amplifier, a mixer, a trans-impedance amplifier, a low-pass filter and a programmable gain amplifier connected in sequence, and the trans-impedance amplifier having a first differential output terminal for providing a first differential signal and a second differential output terminal for providing a second differential signal; and
a power detector, an analog-to-digital converter and a control logic unit in a feedback loop, wherein the power detector is the power detector according to claim 1, and is configured to detect an output power of a trans-impedance amplifier and adjust, by the control logic unit, a gain or an output power of a low noise amplifier connected to a radio frequency signal.

10. The automatic gain control system according to claim 9, wherein the analog-to-digital converter is configured to quantize an output voltage generated by the power detector to generate a voltage code with a constant parameter.

11. The automatic gain control system according to claim 9, wherein the analog-to-digital converter comprises:
a reference voltage generating circuit, which comprises a resistor string sequentially connected between a power supply terminal and ground in series, and provides at least one reference voltage and a common-mode voltage required by a post-circuit by conducting a connecting node between at least two adjacent resistors;
a level shift circuit, configured to generate a base voltage that varies with a process angle of the power detector and a temperature in a same proportion according to a power supply voltage, the at least one reference voltage and the common-mode voltage;
a comparator array, configured to sequentially compare the output voltage with the base voltage according to a time sequence of a clock cycle to generate a thermometer code;
an encoding circuit, connected to the comparator array for converting the thermometer code to a binary code;
an output register circuit, configured to receive the binary code and output the binary code to the low noise amplifier along with a clock cycle.

12. The automatic gain control system according to claim 11, wherein the level shift circuit comprises:
a fourth transistor, a fifth transistor and a sixth transistor, wherein a first terminal of the fourth transistor and a first terminal of the fifth transistor are connected to the power supply terminal, a second terminal of the fourth transistor and a second terminal of the fifth transistor are connected to a first terminal of the sixth transistor, and a second terminal of the sixth transistor is connected to ground,
a control terminal of the fourth transistor and a control terminal of the fifth transistor are respectively connected to the reference voltage, a control terminal of the sixth transistor is connected to the bias voltage,
a first terminal of the sixth transistor serves as the second output node for providing the base voltage.

13. The automatic gain control system according to claim 12, wherein the fourth transistor has the same temperature coefficient as the first transistor, the fifth transistor has the same temperature coefficient as the second transistor, and the sixth transistor has the same temperature coefficient as the third transistor.

14. A control method for the automatic gain control system according to claim 9, comprising:
detecting the output power of the trans-impedance amplifier in the main circuit of the automatic gain control system by using the power detector in the feedback loop of the automatic gain control system; and
acquiring a detection result, converting the detection result into a generated signal through the control logic unit, and adjusting the gain or the output power of the low noise amplifier connected to the radio frequency signal.

15. The control method according to claim 14, wherein the step of acquiring a detection result, converting the detection result into a generated signal through the control logic unit, and adjusting the gain or the output power of the low noise amplifier connected to the radio frequency signal comprises:

providing at least one reference voltage and a common-mode voltage required by a post-circuit by using a reference voltage generating circuit;

generating a base voltage that varies with a process angle of the power detector and a temperature in a same proportion according to a power supply voltage, the at least one reference voltage and the common-mode voltage;

comparing the output voltage with the base voltage according to a time sequence of a clock cycle to generate a thermometer code;

converting the thermometer code to a binary code;

receiving the binary code and outputting the binary code to the low noise amplifier along with a clock cycle.

* * * * *